United States Patent [19]

Forster et al.

[11] Patent Number: 4,940,897
[45] Date of Patent: Jul. 10, 1990

[54] NOVEL PYROELECTRIC DETECTOR

[75] Inventors: Martin Forster, Jona; Claudia Illert, Stafa, both of Switzerland

[73] Assignee: Cerberus AG, Switzerland

[21] Appl. No.: 359,971

[22] Filed: Jun. 1, 1989

[30] Foreign Application Priority Data

Jun. 1, 1988 [CH] Switzerland ............... 2067/88

[51] Int. Cl.⁵ .................. G01J 1/00; B23K 31/02
[52] U.S. Cl. ................................ 250/338.3; 228/123
[58] Field of Search ............. 250/338.3; 228/123; 501/42

[56] References Cited

U.S. PATENT DOCUMENTS

| | | | |
|---|---|---|---|
| 3,511,991 | 5/1970 | Beerman | 250/338.3 |
| 4,024,560 | 5/1977 | Miller et al. | 357/23 |
| 4,110,616 | 8/1978 | Porter et al. | 250/338.3 |
| 4,218,620 | 8/1980 | Oettel | 250/338.3 |
| 4,326,663 | 4/1982 | Oettel | 228/123 |
| 4,631,633 | 12/1986 | Shaulov et al. | 361/321 |
| 4,697,081 | 9/1987 | Baker | 250/338.3 |

FOREIGN PATENT DOCUMENTS 1377625 12/1974 United Kingdom .

OTHER PUBLICATIONS

A. Huanosta and A. R. West, "The Electrical Properties of Ferroelectric LiTaO₃ and Its Solid Solutions," J. Appl. Phys. 61 (12) pp. 5386–5391 (Jun. 15, 1987).

B. Eloudi and M. Zriouil, "Some New Non–Stoichiometric Ferroelectric Phases Appearing Close to LiTaO₃ in the Ternary System Li₂O—Ta₂O₅—(TiO₂)₂," Material Research Bulletin, vol. 16, No. 9, pp. 1099–1106 (1981).

R. L. Barns and J. R. Carruthers, "Lithium Tantalate Single Crystal Stoichiometry," J. Appl. Cryst., vol. 3, pp. 395–399 (1970).

C. B. Roundy and R. L. Byer, "Sensitive LiTaO₃ Pyroelectric Detector", J. Appl. Phys., vol. 44, No. 2, pp. 929–931 (Feb. 1973).

Primary Examiner—Constantine Hannaher
Assistant Examiner—J. Eisenberg
Attorney, Agent, or Firm—Brumbaugh, Graves, Donohue & Raymond

[57] ABSTRACT

A pyroelectric detector comprising a substrate, pyroelectric material distributed in a binder and applied to said substrate, and at least two electrically conductive electrodes, wherein the pyroelectric material comprises lithium tantalate consisting of single crystal particles, said lithium tantalate containing an amount of tantalum ranging from 25 to 75 mole % as tantalum pentoxide.

20 Claims, 1 Drawing Sheet

NOVEL PYROELECTRIC DETECTOR

The present invention relates to a novel pyroelectric detector and novel process for making the same. The pyroelectric detector comprises a substrate, pyroelectric material distributed in a binder and applied to the substrate and at least two electrically conductive electrodes. More specifically, the pyroelectric material is lithium tantalate consisting of single crystal particles having a tantalum content ranging from 25 to 75 mole % as tantalum pentoxide.

BACKGROUND OF THE INVENTION

Pyroelectric radiation receivers, i.e., radiation detectors and pyrodetectors, have generally consisted of a thin pyroelectric single crystal with one electrode each on the faces perpendicular to the polar axis. See, for example, J. Appl. Phys. Vol. 44, No. 2, pages 929 –931 (Feb. 1973). A problem in the preparation of such pyroelectric radiation detectors generally consists in the fact that the single crystal must be accurately cut so that the planes of the electrode surfaces are perpendicular to the ferroelectric axis of the crystal. Moreover, the preferred material for pyroelectric detectors has been triglycine sulfate (TGS) which in the form of a single crystal is very brittle and must be handled with extreme care during preparation and use of the detector.

In response to these problems U.S. Pat. No. 3,511,991 (German Offenlegungsschrift No. 19 05 197) and British Patent No. 1,377,625) disclosed the preparation of pyroelectric detector elements by applying pyroelectric microcrystals, e.g. TGS or lithium sulfate monohydrate, to a substrate by means of a binder, and orienting the ferroelectric axes of the microcrystals by a one-time application of a polarizing d.c. voltage.

The pyroelectric detector disclosed in U.S. Pat. No. 3,511,991 has been found to have a number of drawbacks. For example, triglycine salts have a Curie temperature of less than 50° C. and are unsuitable where temperatures exceed about 50° C. since depolarization will occur and the detector will no longer deliver a signal. Accordingly, since pyroelectric detectors are generally subjected to temperatures of about 150 to 200° C., e.g. in curing binding agents, soldering, drying etc., triglycine salts are not feasible. The prior art '991 patent further discloses that the maximum content of thermoplastic binder is 25% by weight of the triglycine salt (microcrystals). However, it has been found that a higher proportion of binder is desirable since it enables the dielectric constant of the pyroelectric material to be reduced without causing any significant change in the pyroelectric coefficient. Another drawback is that a thermoplastic binder will become soft upon poling at high temperatures. Finally, the lithium sulfate monohydrate disclosed as suitable pyroelectric material in U.S. Pat. No. 3,511,991 is exceedingly hygroscopic and this property results in pyrodetectors having unacceptably low d.c. resistance and a signal drop.

British Patent No. 1,377,625 discloses a pyrodetector which consists of a pyroelectric ceramic distributed in an electrically insulating binder. However the quality coefficient of this pyrodetector is insufficient. The pyroelectric quality coefficient G is defined as $$G = \frac{p}{DK \cdot D \cdot c} \; C \cdot cm/J$$

wherein p is the pyroelectric coefficient in $\partial C/m^2 \cdot K$, DK the dielectric constant, D the density in $g/cm^3$ and c the heat capacity in $J/g \cdot K$).

Accordingly, the object of the present invention is to provide a pyroelectric detector which avoids the drawbacks of the pyroelectric detectors discussed above. More specifically, the object of the invention is to provide a pyroelectric detector which has an elevated Curie temperature e.g. about 610° C.; which undergoes no depolarization during the preparation and operation of the detector; in which the pyroelectric coefficient p and the dielectric constant DK are practically temperature-independent in the range of −30° C. to +80° C.; which has a considerably improved quality coefficient compared to the pyrodetectors known in the art; which has a high d.c. resistance; and which uses a nonhygroscopic material, so that aging through water uptake is prevented.

These objectives are met by the pyroelectric detector of the type described and illustrated hereinbelow and the process disclosed for making the same.

DETAILED DESCRIPTION OF THE INVENTION

Figure 1:
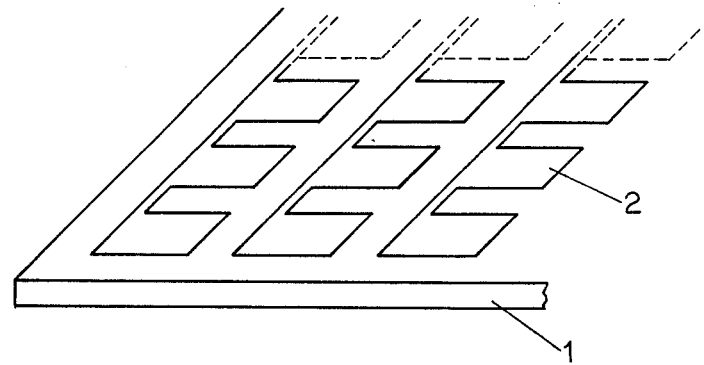
FIG. 1 is a perspective view of the substrate with the first electrode prior to the application of a layer of lithium tantalate and binder mixture.
Figure 2:
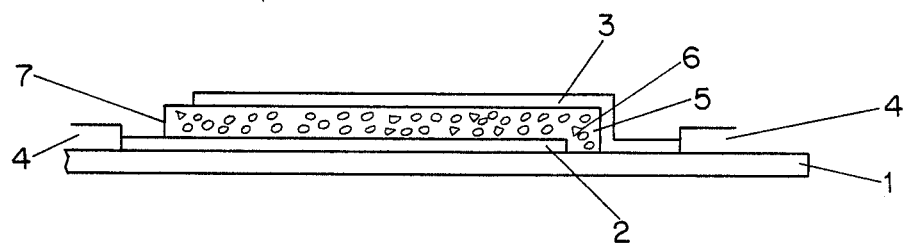
FIG. 2 is a cross-section through the pyroelectric detector of the present invention.

With reference to FIGS. 1 and 2, the pyroelectric detector has a suitable substrate (1) material, for example aluminum oxide; a first electrode (2); a layer of pyroelectric material (7) consisting of lithium tantalate (6), dispersed in a binder material (5), such that the thickness of the layer ranges between about 1 to 300 $\mu$; and a second electrode (3) applied to the pyroelectric layer (7). FIG. 2 also depicts elements (4) which are electrical leads.

The binder composition for use in connection with the pyroelectric material is a glass powder comprising the element lead in the form of its oxide and at least three other oxides selected from the group consisting of boron, aluminum, silicon, cadmium and vanadium.

The weight % of the oxides in the glass powder are:

|  |  | Preferred Amounts |
|---|---|---|
| Boron | 0–25% | 1–10% |
| Aluminum | 0–20% | 1–10% |
| Silicon | 0–50% | 2–20% |
| Lead | 40–99% | 60–92% |
| Cadmium | 0–40% | 1–20% |
| Vanadium | 0–50% | 0–30% |

The binder may also contain up to 5% by weight of oxides of chromium, nickel and/or cobalt. All of these amounts are based on the weights of the elements and not the oxides. A particular advantage realized from using the additional oxides is that a distinctive color is imparted to the layer which is useful during assembly of the detector. The binder glasses are water repellant, non-hygroscopic, and have a melting point above the poling temperature of the pyroelectric detectors. The glass is subsequently powdered and converted into a fluid paste by combining it with a suitable high-boiling solvent, for example, terpineol or other such suitable solvents.

Single crystals of lithium tantalate are mixed with the binder paste such that the range in parts by weight of lithium tantalate to binder is about 0.1:1 to 5:1. A preferred ratio range of lithium tantalate to binder is 0.3:1 to 3:1; and a 1:1 lithium tantalate to binder ratio is most preferred. The specific weight of the binder may vary greatly, depending on its chemical composition.

The lithium tantalate composition has a tantalum content ranging from 25 to 75 mole % as tantalum pentoxide. A preferred tantalum content of the lithium tantalate composition is 35 to 65 mole % as tantalum pentoxide; and an even more preferred lithium tantalate composition has a tantalum content of from 45 to 55 mole % as tantalum pentoxide. It has also been found that the lithium tantalate composition may contain up to 15 mole % of vanadium pentoxide.

Single crystals of lithium tantalate are pulverized and screened and the fraction having a particle size ranging from about 0.1 to 75 microns, preferably 1.0 to 20 microns are mixed with the binder composition.

As described hereinbefore, the lithium tantalate and binder mixture is applied to the surface of the substrate to form a layer of pyroelectric material. This processing step may be accomplished by means of a template, the use of which will be described in greater detail in the examples which follow. The pyroelectric layer is then burned-in at high temperature, for example at a temperature of about 500° C. The application of the lithium tantalate and binder composition is controlled so that the pyroelectric layer after burning-in ranges between 1 to 300 microns, and preferably 20 to 150 microns thick.

The dimensions (length and width) of the pyroelectric layer can be freely chosen. However, when using a screen printing machine to apply a second inert metal electrode to the surface of the pyroelectric layer, the dimensions of the layer will be limited by the size of the screen printing machine.

After applying the second electrode, the pyroelectric layer is poled by application of a field strength of a few MV/m to the electrodes.

The novel pyroelectric detector and process for preparing the pyroelectric detector of the present invention is further disclosed in the context of the following specific examples.

EXAMPLE 1

A glass powder obtained by mixing 2.57 g of boric acid, 0.33 g of aluminum oxide, 1.35 g of silicon dioxide, 5.86 g of lead oxide and 1.93 g of cadmium acetate, fusing at 800° C. and then pulverizing, was mixed with such an amount of terpineol that a highly fluid paste of the binder was obtained. Single crystals of lithium tantalate containing 36.7 mole % of tantalum pentoxide, 63 mole % of lithium oxide and 0.3 mole % of vanadium pentoxide were pulverized and screened. The fraction having a particle size of 5 to 10 $\mu$ was mixed with the binder paste so that the weight ratio of lithium tantalate to binder 1.04:1. A thickly liquid paste was obtained which was coated by means of a template made of 50 $\mu$ thick sheet steel and having an opening of 5 $\times$5 mm onto an aluminum oxide substrate having a gold electrode, and then burned in at 500° C.

Over the first layer, a second layer was applied in a similar manner by means of a 100 $\mu$ thick sheet metal template, and burned in again at 500° C. The whole pyroelectric layer was approximately 107 $\mu$ thick. A gold electrode was applied to this second pyroelectric layer by means of screen printing and burned in also at 500° C. Cermalloy C4350 which is commercially available was used as screen printing paste. An electric field strength of 4 MV/m was then applied between the upper and lower electrode for 5 minutes at 450° C. and the pyroelectric layer was thereby poled.

The layer had pyroelectric quality coefficient

EXAMPLE 2

The binder paste used and the ratio of lithium tantalate to binder employed were the same as in Example 1. The lithium tantalate powder had a particle size of <5 $\mu$. The pyroelectric layer was applied and poled as in Example 1. The layer had a pyroelectric quality coefficient $$G=0.194\times 10^{-10} C\cdot cm/J.$$

EXAMPLE 3

The binder paste used and the ratio of lithium tantalate to binder employed were the same as in Example 1. The lithium tantalate powder had a particle size of 10 to 20 $\mu$. The pyroelectric layer was applied and poled as in Example 1.

The layer had a pyroelectric quality coefficient $$G=0.733\times 10^{-10} C\cdot cm/J.$$

EXAMPLE 4

The binder paste used and the ratio of lithium tantalate to binder employed were the same as in Example 1. The lithium tantalate powder had a particle size of 20 to 75 $\mu$. The pyroelectric layer was applied and poled as in Example 1.

The layer had a pyroelectric quality coefficient $$G=0.733\times 10^{-10} C\cdot cm/J.$$

EXAMPLE 5

The binder paste used was the same as in Example 1. In this case the ratio of lithium tantalate to binder was 1.2 to 1. The lithium tantalate powder had a particle size of 10 to 20 $\mu$. The pyroelectric layer was applied as in Example 1 and poled by application of an electric field strength of 4.4 MV/m.

The layer had a pyroelectric quality coefficient $$G=0.776\times 10^{-10} \ C.cm/J.$$

EXAMPLE 6

The binder paste used was the same as in Example 1. In this case the ratio of lithium tantalate to binder was 0.8 to 1. The lithium tantalate powder had a particle size of 10 to 20 $\mu$. The pyroelectric layer was applied as in Example 1 and poled by application of an electric field strength of 4.5 MV/m.

The layer had a pyroelectric quality coefficient $$G=0.714 \ 10^{-10} \ C.cm/J.$$

EXAMPLE 7

The binder paste used was the same as in Example 1. In this case the ratio of lithium tantalate to binder was 0.6 to 1. The lithium tantalate powder had a particle size of 10 to 20 μ. The pyroelectric layer was applied as in Example 1 and poled by application of an electric field strength of 4.1 MV/m.

The layer had a pyroelectric quality coefficient $$G = 0.525 \times 10^{-10} \ C.cm/J.$$

EXAMPLE 8

The binder paste used was the same as in Example 1. In this case the ratio of lithium tantalate to binder was 0.4 to 1. The lithium tantalate powder had a particle size of 10 to 20 μ. The pyroelectric layer was applied as in Example 1 and poled by application of an electric field strength of 3.1 MV/m.

The layer had a pyroelectric quality coefficient $$G = 0.177 \times 10^{-10} \ C.cm/J.$$

EXAMPLE 9

The binder paste used was the same as in Example 1. In this case the ratio of lithium tantalate to binder was 1.6 to 1. The lithium tantalate powder had a particle size of 10 to 20 μ. The pyroelectric layer was applied as in Example 1 and poled by application of an electric field strength of 1.2 MV/m.

The layer had a pyroelectric quality coefficient $$G = 0.515 \times 10^{-10} \ C.cm/J.$$

EXAMPLE 10

The binder paste used was the same as in Example 1. In this case the ratio of lithium tantalate to binder was 2.4 to 1. The lithium tantalate powder had a particle size of 10 to 20 μ. The pyroelectric layer was applied as in Example 1, and poled by application of an electric field strength of 2.0 MV/m.

The layer had a pyroelectric quality coefficient $$G = 0.364 \times 10^{-10} \ C.cm/J.$$

EXAMPLE 11

A glass powder obtained by melting 1.26 g of boric acid, 0.49 g of aluminum oxide, 1.22 g of silicon dioxide, 7.36 g of lead oxide and 0.52 g of cadmium acetate, fusing at 850° C. and then pulverizing, was mixed with an amount of terpineol such that a highly fluid paste of the binder was obtained. Single crystals of lithium tantalate containing 51.3 mole % of tantalum pentoxide and 48.7 mole % of lithium oxide were pulverized and screened. The fraction having a particle size of 10 to 20 μ was mixed with the binder paste so that the weight ratio of lithium tantalate to binder was 1.6 to 1. A thickly liquid paste was obtained which was coated by means of a 200-mesh screen and a 50 μ thick sheet steel template with an opening of 5×5 mm onto an aluminum oxide substrate having a gold electrode, and then burned in at 500° C.

Over the first layer, a second layer was applied by means of the same screen in a similar manner, and again burned in at 500° C. The whole pyroelectric layer was now 99 μ thick. A gold electrode was applied to the surface of the pyroelectric layer by means of screen printing, and burned in also at 500° C. The commercially available Cermalloy C4350 was used as screen printing paste. An electric field strength of 4 MV/m was then applied between the upper and lower electrode for 5 minutes at 450° C. and the pyroelectric layer was thereby poled.

The layer had a pyroelectric quality coefficient $$G = 0.651 \times 10^{-10} \ C.cm/J.$$

EXAMPLE 12

The binder paste used was the same as in Example 11. In this case the ratio of lithium tantalate to binder was 0.4 to 1. The lithium tantalate powder had a particle size of 10 to 20 μ. The pyroelectric layer was applied as in Example 11 and poled by application of an electric field strength of 4.0 MV/m.

The layer had a pyroelectric quality coefficient $$G = 0.237 \times 10^{-10} \ C.cm/J.$$

EXAMPLE 13

The binder paste used was the same as in Example 11. In this case the ratio of lithium tantalate to binder was 1.1 to 1. The lithium tantalate powder had a particle size of 10 to 20 μ. The pyroelectric layer was applied as in Example 11 and poled by application of an electric field strength of 4.0 MV/m.

The layer had a pyroelectric quality coefficient $$G = 0.555 \times 10^{-10} \ C.cm/J.$$

EXAMPLE 14

The binder paste used was the same as in Example 11. In this case the ratio of lithium tantalate to binder was 0.8 to 1. The lithium tantalate powder had a particle size of 10 to 20 μ. The pyroelectric layer was applied as in Example 11 and poled by application of an electric field strength of 4.0 MV/m.

The layer had a pyroelectric quality coefficient $$G = 0.447 \times 10^{-10} \ C.cm/J.$$

EXAMPLE 15

The binder paste used was the same as in Example 11. In this case the ratio of lithium tantalate to binder was 3.9 to 1. The lithium tantalate powder had a particle size of 10 to 20 μ. The pyroelectric layer was applied as in Example 11 and poled by application of an electric field strength of 4.0 MV/m.

The layer had a pyroelectric quality coefficient $$G = 0.306 \times 10^{-10} \ C.cm/J.$$

EXAMPLE 16

A glass powder obtained by mixing 2.74 g of boric acid, 0.27 g of aluminum oxide, 1.09 g of silicon dioxide, 4.7 g of lead oxide, 1.55 g of cadmium acetate and 3.57 g of vanadium pentoxide, fusing at 1200° C. and then pulverizing, was mixed with an amount of terpineol such that a highly fluid paste of the binder was obtained. Single crystals of lithium tantalate having the same composition as in Example 1 were pulverized and screened. The fraction having a particle size of <20 μ was mixed with the binder paste so that the weight ratio of lithium tantalate to binder was 1.04 to 1. A thickly liquid paste was obtained which was coated by means of a 200-mesh screen and a 100 μ thick steel template having an opening of 5×5 mm onto an aluminum oxide substrate having a gold electrode, and then burned in at 700° C.

The pyroelectric layer was 102 μ thick. A gold electrode was applied by screen printing and also burned in at 500° C. The commercially available Cermalloy C4350 was used as a screen printing paste. An electric field strength of 4 MV/m was then applied between the upper and lower electrodes for 5 minutes at 450° C., and the pyroelectric layer was thereby poled.

The layer had a pyroelectric quality coefficient $$G = 0.551 \times 10^{-10} \, C.cm/J.$$

Various modification of the above-described construction of the pyroelectric detector and processing conditions for making the same will be apparent to those of ordinary skill in the art and may be made without departing from the spirit and scope of the present invention as claimed hereinbelow.

We claim:

1. A pyroelectric detector comprising a substrate, pyroelectric material distributed in a binder and applied to said substrate, and at least two electrically conductive electrodes, wherein the pyroelectric material comprises lithium tantalate consisting of single crystal particles, said lithium tantalate containing an amount of tantalum ranging from 25 to 75 mole % as tantalum pentoxide.

2. A pyroelectric detector according to claim 1, wherein the tantalum content of the lithium tantalate ranges in an amount from 35 to 65 mole % as tantalum pentoxide.

3. A pyroelectric detector according to claim 2 wherein the tantalum content of the lithium tantalate ranges in an amount from 45 to 55 mole % as tantalum pentoxide.

4. A pyroelectric detector according to claim 1 wherein the particle size of the lithium tantalate is from 0.1 to 75 microns.

5. A pyroelectric detector according to claim 4 wherein the particle size of the lithium tantalate is from 1.0 to 20 microns.

6. A pyroelectric detector according to claim 1 wherein the binder comprises a glass containing lead oxide and at least three metal oxides selected from the group consisting of boron, aluminum, silicon, cadmium and vanadium.

7. A pyroelectric detector according to claim 6, wherein the binder is a glass containing up to 25% by weight of the oxide of boron, up to 20% by weight of the oxide of aluminum, up to 50% by weight of the oxide of silicon, from 40 to 99% by weight of the oxide of lead, up to 40% by weight of the oxide of cadmium and up to 50% by weight of the oxide of vanadium, said % by weights being based upon the element.

8. A pyroelectric detector according to claim 7 wherein the preferred amounts of said oxides are 1 to 10% boron and aluminum, 2 to 20% silicon, 60 to 92% lead, 1 to 20% cadmium and up to 30% vanadium, said amounts being % by weight based upon the element.

9. A pyroelectric detector according to claim 6, wherein the binder further contains up to 5% of the oxides selected from the group consisting of chromium, nickel and cobalt, said amounts being % by weight based upon the element.

10. A pyroelectric detector according to claim 1, wherein the weight ratio of lithium tantalate to binder is between 0.1:1 and 5:1.

11. A process for the preparation of a pyroelectric detector according to claim 1 comprising forming a binder by melting together lead oxide, and at least three oxides selected from the group consisting of boron, aluminum, silicon, cadmium and vanadium; triturating said binder with a suitable organic solvent to provide a fluid, paste-like composition; mixing said composition with single crystal lithium tantalate particles wherein the tantalum content ranges from 25 to 75 mole % as tantalum pentoxide; applying said mixture to an inert substrate having a first inert electrode to form a layer of pyroelectric material; burning-in said layer at a high temperature; applying a second inert metal electrode to said layer; and poling the layer by applying a field strength of a few MV/m to the electrodes.

12. A process according to claim 11, wherein the size of the lithium tantalate particles ranges from 0.1 to 75 microns.

13. A process according to claim 11 wherein the size of the lithium tantalate particles ranges from 1.0 to 20 microns.

14. A process according to claim 11, wherein the lithium tantalate and binder are mixed in a weight ratio of 0.1:1 to 5:1.

15. A process according to claim 11, wherein the second electrode is applied by screen printing.

16. A process according to claim 11, wherein the lithium tantalate and binder mixture is applied such that after burning in, the layer has a thickness of from about 1 to 300 microns.

17. A process according to claim 15 where the thickness of the burned in layer is from about 2 to 150 microns.

18. A process according to claim 11, wherein the binder additionally contains up to 5.0% by weight of oxides selected from the group consisting of chromium, nickel and cobalt, said % by weight based upon the element.

19. A process according to claim 11, wherein the tantalum content of the lithium tantalate ranges from 35 to 65 mole % as tantalum pentoxide.

20. A process according to claim 11, wherein the tantalum content of the lithium tantalate ranges from 45 to 55 mole % as tantalum pentoxide.

* * * * *

UNITED STATES PATENT AND TRADEMARK OFFICE
CERTIFICATE OF CORRECTION

PATENT NO. : 4,940,897

DATED : July 10, 1990

INVENTOR(S) : Forster et al.

It is certified that error appears in the above-identified patent and that said Letters Patent is hereby corrected as shown below:

Col. 1, line 31, after "1,377,625" delete " ) ";

Col. 2, line 3, after "J/g.K" delete " ) ";

Col. 3, line 22, "are" should read --is--;

Col. 3, line 60, after "binder" insert --was--;

Col. 4, following line 8, insert --$G = 0.420 \times 10^{-10}$ C.cm/J.--; and

Col. 8, line 44, "where" should read --wherein--.

Signed and Sealed this

Eighth Day of October, 1991

Attest:

HARRY F. MANBECK, JR.

*Attesting Officer*     *Commissioner of Patents and Trademarks*